United States Patent [19]

Okumura et al.

[11] Patent Number: 5,428,239
[45] Date of Patent: Jun. 27, 1995

[54] SEMICONDUCTOR DEVICE HAVING RETROGRADE WELL AND DIFFUSION-TYPE WELL

[75] Inventors: Yoshinori Okumura; Tomonori Okudaira; Hideaki Arima, all of Hyogo, Japan

[73] Assignee: Mitsubishi Denki Kabushiki Kaisha, Tokyo, Japan

[21] Appl. No.: 71,023

[22] Filed: Jun. 3, 1993

Related U.S. Application Data

[63] Continuation of Ser. No. 693,299, Apr. 30, 1991, abandoned.

[30] Foreign Application Priority Data

May 2, 1990 [JP] Japan .................. 2-116276

[51] Int. Cl.[6] .................. H01L 27/092; H01L 27/108
[52] U.S. Cl. .................. 257/371; 257/374; 257/396; 257/657
[58] Field of Search .................. 357/42, 23.11, 23.6; 257/371, 374, 396, 657

[56] References Cited

U.S. PATENT DOCUMENTS 4,411,058  10/1983  Chen .................. 29/571
4,907,058   3/1990  Sakai .................. 357/42

FOREIGN PATENT DOCUMENTS 60-200568  10/1985  Japan .
63-305546  12/1988  Japan .

OTHER PUBLICATIONS

"An Experimental 1-Mbit BiCMOS DRAM", Kitsukawa et al., IEEE Journal of Solid-State Circuits, vol. SC-22, No. 5, Oct. 1987, pp. 657-662.
"A 0.5 μm Isolation Technology Using Advanced Poly Silicon Pad LOCOS (Appl)," IEDM '88, pp. 100-103.
"An Advanced Half-Micrometer CMOS Device with Self-Aligned Retrograde Twin-Wells and Buried P+ Layer," VLSI Symposium, 1989.
"A New Twin-Well CMOS Process Using Nitridized-Oxide-LOCOS (NOLOCOS) Isolation Technology," IEEE Electron Device Letters, vol. 10, No. 7, Jul., 1989, pp. 307-309.

Primary Examiner—William D. Larkins
Attorney, Agent, or Firm—Lowe, Price, LeBlanc & Becker

[57] ABSTRACT

A DRAM is formed on a silicon substrate having a retrograde well and a diffusion-type well. The retrograde well has an impurity concentration profile which is set in steps by a plurality of ion-implantations. The diffusion-type well has an impurity concentration profile which changes monotonously by a thermal diffusion. A memory cell array is formed in the retrograde well region. A peripheral circuit is formed in the diffusion-type well region. The retrograde well enhances integration of devices included in the memory cell array. The diffusion-type well enhances the characteristic of insulating isolation between devices.

8 Claims, 8 Drawing Sheets

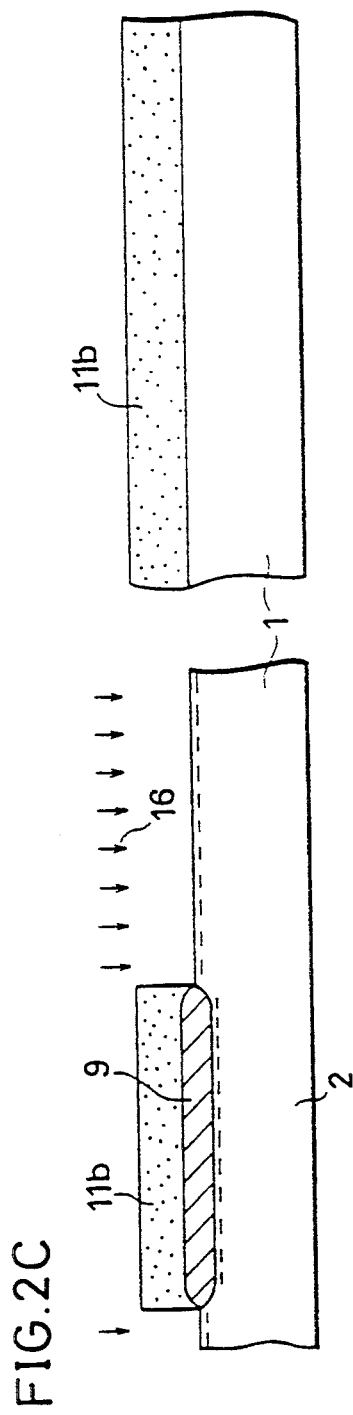
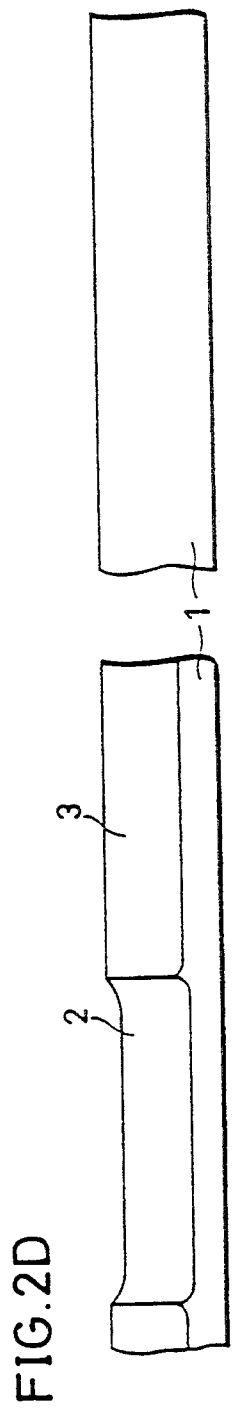
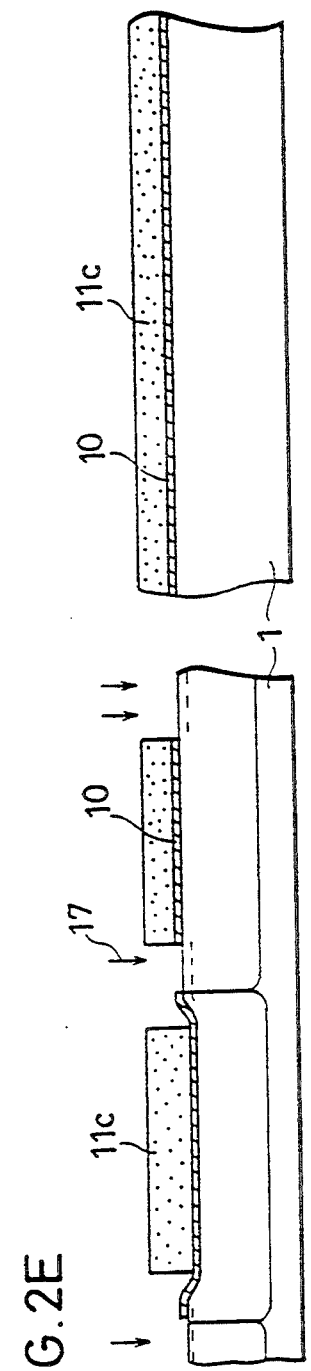
FIG.2C
FIG.2D
FIG.2E

SEMICONDUCTOR DEVICE HAVING RETROGRADE WELL AND DIFFUSION-TYPE WELL

This application is a continuation of application Ser. No. 07/693,299 filed Apr. 30, 1991 now abandoned.

BACKGROUND OF THE INVENTION

1. Field of the Invention

The invention relates to semiconductor devices with wells formed in a semiconductor substrate and having different impurity concentration profiles.

The invention further relates to a manufacturing method for forming wells having different impurity concentration profiles in a semiconductor substrate.

2. Description of the Background Art

FIG. 3 is a structural cross-sectional view showing a well structure used in a conventional semiconductor memory device. A p-well 2 and an n-well 3 of different conductivity types are formed on the surface region of a p-type silicon substrate 1. A field oxide 8 for isolation is formed in predetermined regions on the surface of each of the well regions 2, 3. A channel stopper 26 is formed under the field oxide 8. The well shown in FIG. 3 has a so-called diffusion-type well structure formed using a thermal diffusion process. An MOS transistor 6 is formed on the surface of the p-well region 2 and a p MOS transistor 7 is formed on the surface of the n-well region 3. While only one transistor is shown in the drawing, this is only by way of example and, actually, a plurality of transistors and other functional devices are formed. The n MOS transistor 6 has a gate electrode 27 and a pair of n-type source-drain regions 25, 25. The p MOS transistor 7 has a gate electrode 27 and a pair of p-type source-drain regions 24, 24.

A manufacturing method of the well structure shown in FIG. 3 will now be described. FIGS. 4A to 4F are cross-sectional views of a manufacturing process of the well structure in FIG. 3. Firstly, as shown in FIG. 4A, a nitride film 10 and a resist 11a are deposited on the surface of the p-type silicon substrate 1, and then patterned to a predetermined configuration. An n-type impurity ions 15 such as phosphorus (P) are implanted on the surface of the silicon substrate 1 with the patterned resist 11a as a mask.

Then, as shown in FIG. 4B, a thick LOCOS (Local Oxidation of Silicon) oxide film 9 is formed on the surface of the n well region by a thermal oxidation method using the nitride film 10 as a mask.

Furthermore, as shown in FIG. 4C, after covering the surface of the LOCOS oxide film 9 with a resist 11b, a p-type impurity ions 16 such as boron (B) are implanted on the surface of the silicon substrate 1 with the resist 11b as a mask.

Then, as shown in FIG. 4D, an n-well and a p-well regions 3, 2 are formed by applying a several hours of thermal treatment at 1100° C. to 1200° C. and thermally diffusing the impurity. After that, LOCOS oxide film 9 is removed.

Furthermore, as shown in FIG. 4E, after forming the nitride film 10 and the resist 11c on the surface of the silicon substrate 1, patterning is effected and only a region where a field oxide should be formed is apertured. Then a resist pattern is newly formed only in the region to be an n-well and, using this as a mask, an impurity ions 17 of the same conductivity type as that of the well region 2 are supplied on the surface of the silicon substrate 1.

After that, as shown in FIG. 4F, a thermal oxidation treatment with the nitride film 10 as a mask is applied and a field oxide 8 and a channel stopper 26 are formed.

The above-mentioned diffusion-type well structure has, however, a disadvantage that a so-called narrow channel effect is caused. FIG. 5 is a structural plan view prepared for describing the narrow channel effect. Referring to FIGS. 3 and 5, a $p^{30}$ channel stopper 26 of a higher concentration than that of p-well region is formed under the field oxide 8. The channel stopper 26 diffuses from the region under the field oxide to the channel region of a MOS transistor 6 by the effect of the heat applied on the substrate in a process for forming the MOS transistor 6 on the surface of the p-well region 2. The gate width W of the MOS transistor 6 is therefore decreased. The concentration of the substrate is effectively increased in terms of an average effect. Such a narrow channel effect decreases the drive current of the transistor or increases the threshold voltage. FIG. 6 is a diagram showing the relationship between the channel width and the threshold voltage of the transistor. As shown in the drawing, it can be seen that the MOS transistor formed in the diffusion-type well region has the threshold voltage $V_{TH}$ suddenly raised when the channel width becomes 0.8 μm or below.

There is a tendency that it is difficult to set the threshold voltage $V_{TH}$ of a MOS transistor formed on the surface to a low level in a diffusion-type well structure. FIG. 7 is an impurity concentration profile diagram showing an impurity concentration profile of the substrate depth direction of a well formed by a diffusion method. The diagram shows a profile in which the impurity concentration changes smoothly with respect to the substrate depth direction from the surface of the substrate. In this case, when channel doping is effected in the vicinity of the surface of the substrate, the concentration of the substrate is increased and the threshold voltage $V_{TH}$ of a transistor formed on the surface is increased. When the threshold voltage $V_{TH}$ is increased, the drive current of the transistor is decreased. When a high concentration region of the impurity is formed on the surface of the substrate, impurity scattering becomes ready to occur on this surface, and furthermore the junction capacitance of the source-drain and the substrate is increased, so that the drive current of the transistor is decreased.

A retrograde well structure is proposed as a structure for overcoming the above-mentioned disadvantage of a diffusion-type well structure. FIG. 8 is a structural cross-sectional view showing this retrograde well structure. That is, a p-well region 2 and an n-well region 3 formed on the surface of a p-type silicon substrate 1 respectively have predetermined concentration profiles which were set using a high-energy ion implantation method, respectively. A manufacturing process of this retrograde well structure will be described in the following.

FIGS. 9A to 9C are cross-sectional views of a manufacturing process of a retrograde well structure. Firstly, as shown in FIG. 9A, field oxides 8a, 8b are formed in predetermined positions on the surface of the silicon substrate 1 using the LOCOS method. After that, a resist pattern 11a is coated on a region where a p-well region 2 should be formed. Then, an n-type impurity ions 16 such as phosphorus are implanted with a predetermined implantation energy to form a first impurity concentration region 3c at a deep position in the silicon substrate 1.

Next, as shown in FIG. 9B, the second ion implantation is conducted to form a second impurity concentration regions 3b such that a high concentration region may be located under the field oxides 8a, 8b.

Furthermore, as shown in FIG. 9C, the third ion implantation is conducted to form a third impurity concentration region 3c of a predetermined concentration on the substrate surface. An n-well region 3 having a predetermined impurity concentration profile is formed by the above-mentioned ion-implantation process. A p-well region 2 is also formed using a method similar to the above-mentioned.

An impurity concentration profile of the retrograde well region formed by the above-mentioned processes is shown in FIG. 10. Referring to FIG. 10, this retrograde well structure is characterized in that impurity concentration regions each having a predetermined function can be formed in the direction of the substrate depth of the well region. That is, the first impurity concentration region 3a formed at the deep position of the substrate is effective for preventing a so-called latch up phenomenon. The second impurity concentration region 3b located at the intermediate depth functions as a channel stop region for isolation. The third impurity concentration region 3c formed near the surface of the substrate controls the occurrence of a punch through phenomenon or controls the threshold voltage $V_{TH}$ of the transistor.

In this way, in accordance with a well structure having an optimized concentration profile, it is possible to overcome a problem such as a narrow channel effect as caused in the above-mentioned diffusion-type well or an increase of the threshold voltage.

When it was intended to employ this retrograde well structure over the overall surface of the substrate, however, a new problem as in the following arose. That is, in a semiconductor integrated circuit device formed on one chip, different functions are sometimes required for structural devices in circuits of each kind. For example, in a DRAM, it is necessary to miniaturize the structures of devices such as transistors and enhance integration in a memory cell portion to be a memory region. For this reason, the transistor structure is miniaturized and the isolation region is similarly miniaturized. Conversely, there is relatively less need for miniaturizing or integrating in the peripheral circuits, and rather much importance is attached to a high speed responsibility of the devices. The structures of the transistors are therefore adapted to ensure a comparatively large channel width. Therefore, the arrangement has more space left compared with that of the memory cell and a relatively wide area is occupied by the isolation region. As stated above, a thermal oxide film formed by the LOCOS method is used as an insulating film for isolation. This thermal oxide film has the thickness changed in accordance with the width of the oxide film extending on the surface of the substrate (hereinafter referred to as isolation width). This state is shown in FIGS. 11A and 11B. FIG. 11B is a typical diagram for describing the relationship between the isolation width and the thickness of a field isolation film 8 formed by the LOCOS method. In FIG. 11B (a), the opening width of a nitride film 10 patterned on the surface of the silicon substrate 1 defines the isolation width of the field isolation film. A thermal oxidation treatment is applied to the surface of the silicon substrate 1 using this nitride film 1 as a mask.

A field isolation film 8 is thereby formed with a thickness t as shown in FIG. 11B (b). The width of this field isolation film 8 is formed to be wider than the above-mentioned isolation width by the area where a so-called bird's beak is formed. FIG. 11A shows the relationship between the above-mentioned isolation width and the thickness t of the oxide film to be formed. As seen from this diagram, there is a relationship that as the isolation width is decreased, the thickness thereof t is also decreased. Referring back to FIG. 8, the isolation width of the field isolation film 8b is relatively narrow when it is formed in a memory cell array, and the isolation width of the field isolation film 8a is formed to be relatively wide when it is formed in the peripheral circuits. Therefore, the both thicknesses of the field oxides are made different from each other. The difference of the thickness between the field isolation films 8a, 8b causes a disadvantage. That is, referring to FIG. 9B, the second impurity concentration region 3b is formed such that it comes in contact with the lower surfaces of the field isolation films 8a, 8b by the second ion-implantation. If the ion-implantation energy is set such that the second impurity concentration region 3b may be formed under the thick field isolation film 8a, however, this second impurity concentration region 3b is formed at a deeper position than the portion under the thin field isolation film 8b, and it does not function as a channel stopper anymore. Conversely, if the second ion-implantation energy is optimized for the thin field isolation film 8b, there occurs a disadvantage that no channel stopper is formed under the thick field isolation film 8a.

SUMMARY OF THE INVENTION

An object of the present invention is to provide a semiconductor device with a well structure having an optimum impurity concentration profile in accordance with the characteristic of an integrated circuit.

Another object of the invention is to provide a structure of an optimum arrangement of a diffusion-type well and a retrograde well in accordance with the characteristic of each circuit in a semiconductor device.

Still another object of the invention is to provide a manufacturing method of a semiconductor device having a diffusion-type well and a retrograde well.

In a first aspect of the present invention, a semiconductor device includes a semiconductor substrate having a main surface, a first well region formed in the main surface of the semiconductor substrate and having an impurity concentration profile which is set in steps with respect to the substrate depth direction from the main surface of the semiconductor substrate to the substrate depth, and a second well region formed in the main surface of the semiconductor substrate independently of the first well region and having an impurity concentration profile which changes monotonously with respect to the substrate depth direction from the main surface of the semiconductor substrate.

In accordance with a second aspect of the present invention, a semiconductor device further includes, in addition to the above-mentioned devices, a memory cell array including a memory cell portion in which a plurality of memory cells in a minimum unit are arranged for storing storage information and a circuit portion connected to this memory cell portion for effecting an access operation for writing/reading the storage information, and a peripheral circuit portion interposed between the memory cell array and an external circuit for effecting a predetermined circuit operation, the memory cell array being formed on the surface of the first well region and the peripheral circuit portion being formed on the surface of the second well region.

In a third aspect of the invention, a semiconductor device includes a semiconductor substrate having a main surface, a first well region formed in the main surface of the semiconductor substrate and having an impurity concentration profile which is set in steps with respect to the substrate depth direction from the main surface of the semiconductor substrate, a second well region formed in the main surface of the semiconductor substrate independently of the first well region and having an impurity concentration profile which changes monotonously with respect to the substrate depth direction from the main surface of the semiconductor substrate, a first insulating isolation layer for isolation formed in a predetermined region on the surface of the first well region and having an isolation width of 0.6 μm or below substantially defined by a mask layer for forming the first insulating isolation layer, and a second insulating isolation layer formed in a predetermined region on the surface of the second well region and having an isolation width of 0.6 μm or above.

In a fourth aspect of the invention, a semiconductor device includes a semiconductor substrate having a main surface, a first well region formed in the surface of the semiconductor substrate and having an impurity concentration profile which is set in steps with respect to the substrate depth direction from the main surface of the semiconductor substrate, a second well region formed in the main surface of the semiconductor substrate independently of the first well region and having an impurity concentration profile which changes monotonously with respect to the substrate depth direction from the main surface of the semiconductor substrate, a first MOS transistor formed on the surface of the first well region and having a channel width of 0.8 μm or below, and a second MOS transistor formed on the surface of the second well region and having a channel width of 0.8 μm or above.

A fifth aspect of the invention is directed to a method of manufacturing a semiconductor memory device having a first well region of a first conductivity type and a second well region of a second conductivity type in each of first and second regions where a device is to be formed on the main surface of the semiconductor substrate, which includes the steps of:

forming a resist pattern having an opening only in a region to be the first well region in the first region where a device is to be formed, on the main surface of the semiconductor substrate;

supplying impurity of a first conductivity type into the semiconductor substrate, using the resist pattern as a mask;

supplying impurity of a second conductivity type into the semiconductor substrate after covering the region to be the first well region in the first region where a device is to be formed, and the second region where a device is to be formed with a resist;

diffusing the impurity supplied into the semiconductor substrate by applying a thermal treatment to form a first well region of the first conductivity type and a second well region of the second conductivity type in the first region where a device is to be formed;

effecting a plurality of ion-implantations after covering the first region where a device is to be formed and a region to be the second well region in the second region where a device is to be formed with a resist to form a first well region of the first conductivity type having a predetermined impurity concentration profile;

effecting a plurality of ion-implantations after covering the first region where a device is to be formed and the first well region in the second region where a device is to be formed with a resist to form a second well region of the second conductivity type having a predetermined impurity concentration profile.

In accordance with the invention, there are provided a retrograde well region where a concentration profile can be optimized and a diffusion-type well region which is excellent in isolation characteristics on one semiconductor substrate. Integration to a high degree is made possible without a narrow channel effect and so on being caused in a MOS transistor or a memory cell array formed in a retrograde well region. Isolation is effected without fail in a MOS transistor or a peripheral circuit formed in a diffusion-type well region.

The foregoing and other objects, features, aspects and advantages of the present invention will become more apparent from the following detailed description of the present invention when taken in conjunction with the accompanying drawings

BRIEF DESCRIPTION OF THE DRAWINGS

FIGS. 2A, 2B, 2C, 2D, 2E, 2F, 2G and 2H are cross-sectional views of a manufacturing process of the DRAM shown in FIG. 1.

DESCRIPTION OF THE PREFERRED EMBODIMENTS

Figure 1:
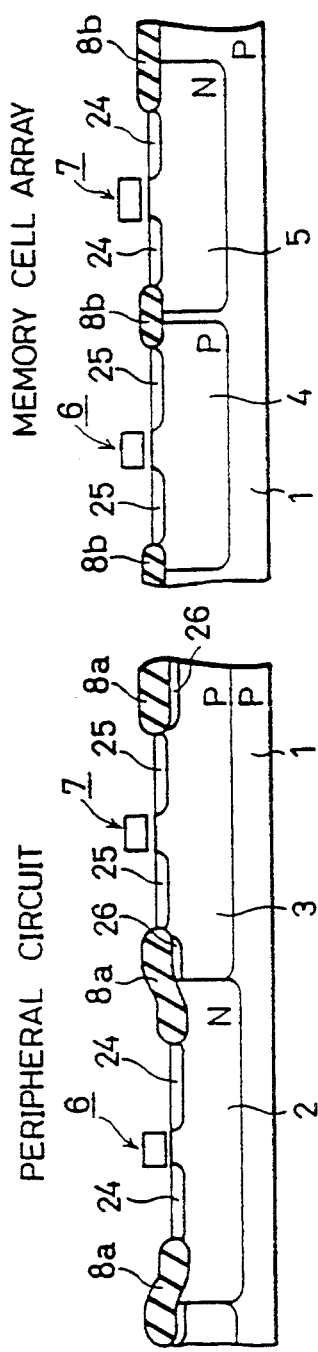
FIG. 1 is a structural cross-sectional view of a DRAM in accordance with one embodiment of the invention.
Figure 10:
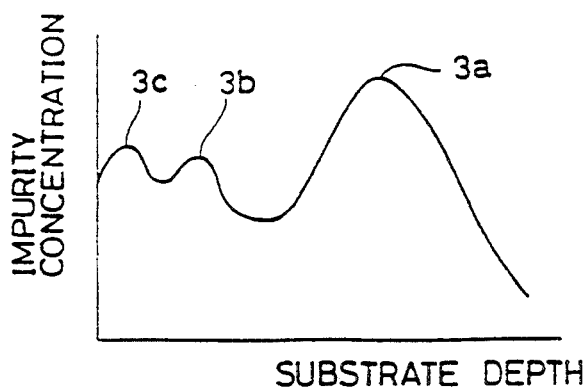
FIG. 10 is a diagram of a concentration profile showing an impurity concentration profile of a retrograde well structure.

A peripheral circuit portion and a memory cell array portion of a DRAM are typically shown in FIG. 1. The memory cell array portion comprises a circuit region including a memory cell, a row decoder, a column decoder, and an I/O gate, a sense amplifier and so on, and the peripheral circuit portion includes circuits such as an input/output buffer, a preamplifier/main amplifier, a clock generating circuit and so on. The difference between these portions will be described with respect to the conditions required for a transistor structure. A MOS transistor included in the memory cell array is required to have a miniaturized structure to enhance its integration. A MOS transistor included in the peripheral circuit is required to have a device structure which ensures a sufficient drive current and is superior in high speed responsibility. Accordingly, in general, the MOS transistor in the memory cell array portion is reduced in size compared with the MOS transistor included in the peripheral circuit. Two types of well regions are used for different purposes under such conditions. That is, the above-mentioned retrograde p-well region 4 and the n-well region 5 are used in the memory cell array. The diffusion-type n-well region 2 and the p-well region 3 are used in the peripheral circuit portion. The impurity concentration profiles of the retrograde well regions 4, 5 have profiles equivalent to that shown in FIG. 10.

A manufacturing method thereof will now be described with reference to FIGS. 2A to 2H.

Figure 2A:
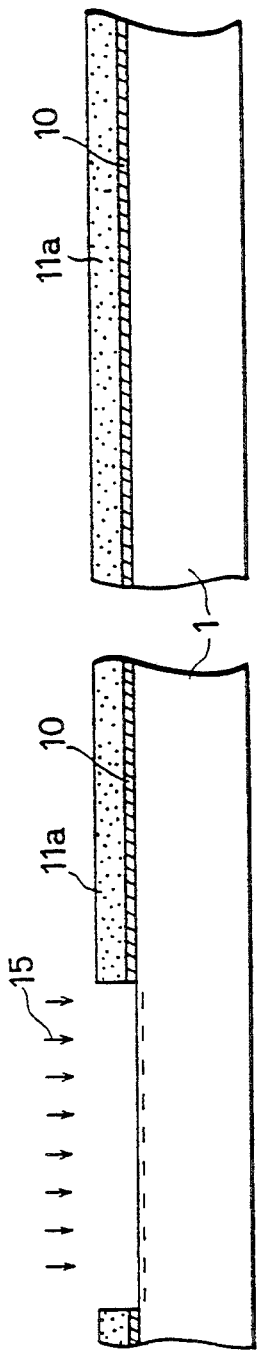

Referring to FIG. 2A, a nitride film 10 and a resist 11a are formed on the surface of a p-type silicon substrate 1 and patterned to a predetermined configuration. An opening is thereby formed only in a portion to be the n-well region 2 in the peripheral circuit. Phosphorus ions 15 are implanted into the substrate with an implantation energy 60 to 200 keV, dose $1.0 \times 10^{12}$ to $1.0 \times 10^{14}$ cm$^{-2}$, using this resist pattern 11a as a mask.

Figure 2B:
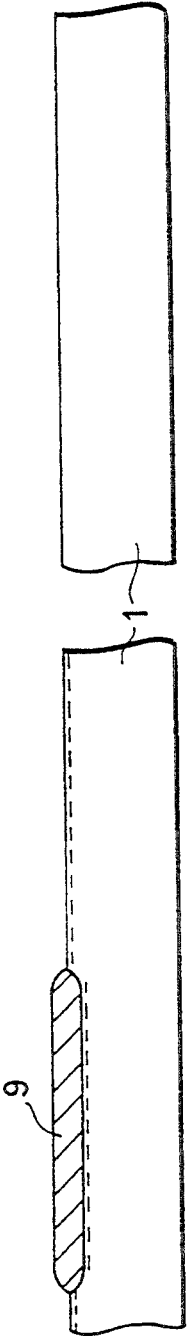

Referring now to FIG. 2B, the surface of the silicon substrate 1 is thermally oxidized with the nitride film 10 as a mask to form a LOCOS oxide film 9. After the formation of the LOCOS oxide, the nitride film 10 is removed.

Referring to FIG. 2C, a region to be an n-well region 2 covered with the LOCOS oxide film 9 and the surface of the silicon substrate 1 to be a memory cell array region are covered with a resist 11b. Boron ions 16 are implanted on the surface of the silicon substrate 1 with the implantation energy 40 to 150 keV, dose $1.0 \times 10^{12}$ to $1.0 \times 10^{14}$ cm$^{-2}$, using the resist 11b as a mask.

Referring to FIG. 2D, after removing the resist 11b, a thermal treatment of several hours at a temperature of 1100° to 1200° C. is applied to diffuse the phosphorus ions or the boron ions deep in the substrate, which were implanted on the surface of the silicon substrate 1 in the peripheral circuit region. The n-well region 2 and the p-well region 3 are thereby formed. This region constitutes a diffusion-type well region.

Referring to FIG. 2E, a nitride film 10 and a resist 11c are formed again on the surface of the silicon substrate 1, a resist pattern having an opening only in the p-well 3 is newly formed, and an opening portion for forming a channel stopper is formed in a predetermined region. Boron ions 17 are implanted in the silicon substrate with these resists as masks.

Figure 2F:
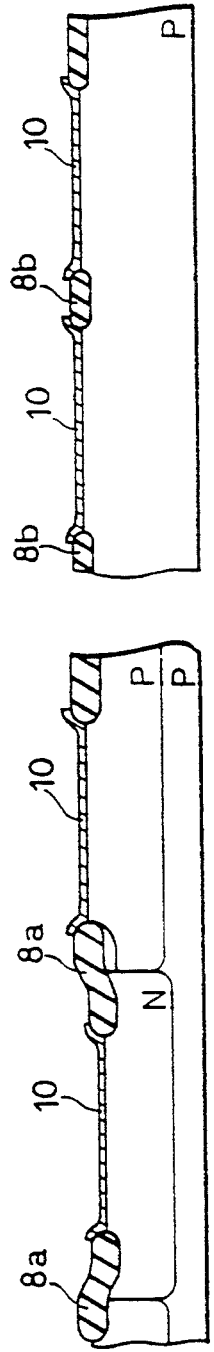

Referring to FIG. 2F, a thermal oxidation treatment is applied using the nitride film 10 as a mask to form field oxides 8a, 8b in predetermined positions. This process of forming field oxides by the thermal oxidation method can be conducted simultaneously in the peripheral circuit and the memory cell array. The isolation width of the field oxide is adapted to be wide in the peripheral circuit and narrow in the memory cell array. Accordingly, the thickness of the film is formed to be thick in the peripheral circuit and thin in the memory cell array.

Figure 2G:
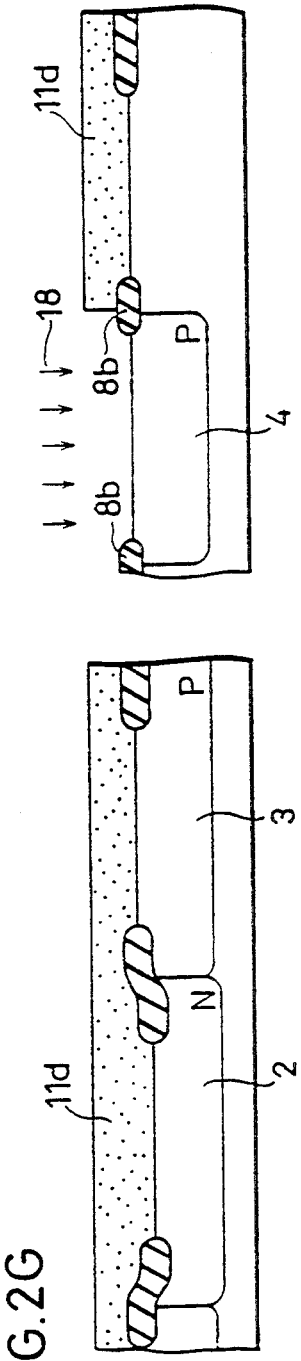

Referring to FIG. 2G, after removing the nitride film 10, the surface of the substrate in the peripheral circuit portion and the region to be the n-well region 5 in the memory cell array portion are covered with a resist 11d. Impurity ions are ion implanted in the region to be the p-well region 4 with the resist 11d as a mask. This ion-implantation is divided into 3 ion-implantation processes to be conducted for constituting a retrograde well. In the first ion-implantation, boron ions 18 are implanted deep in the position of the substrate on a condition of an implantation energy 500 to 1000 keV, dose $1.0 \times 10^{13}$ to $1.0 \times 10^{14}$ cm$^{-2}$. This is conducted for forming a first impurity concentration region 3a for preventing a latch up shown in FIG. 10.

The second boron ion-implantation is conducted under a condition of an implantation energy 120 to 200 keV, doze 2.0 to $8.0 \times 10^{12}$ cm$^{-2}$. This implantation causes a second impurity concentration region 3b to be formed on the lower surface of the field oxide 8b as a channel stopper. Furthermore, boron ions are implanted on a condition of an implantation energy 20 to 50 keV, dose $1.0 \times 10^{11}$ to $1.0 \times 10^{13}$ cm$^{-2}$ in the third implantation. A third impurity concentration region 3c is thereby formed. This region prevents a punch through of the transistor or sets a threshold voltage to an optimum value.

Figure 2H:
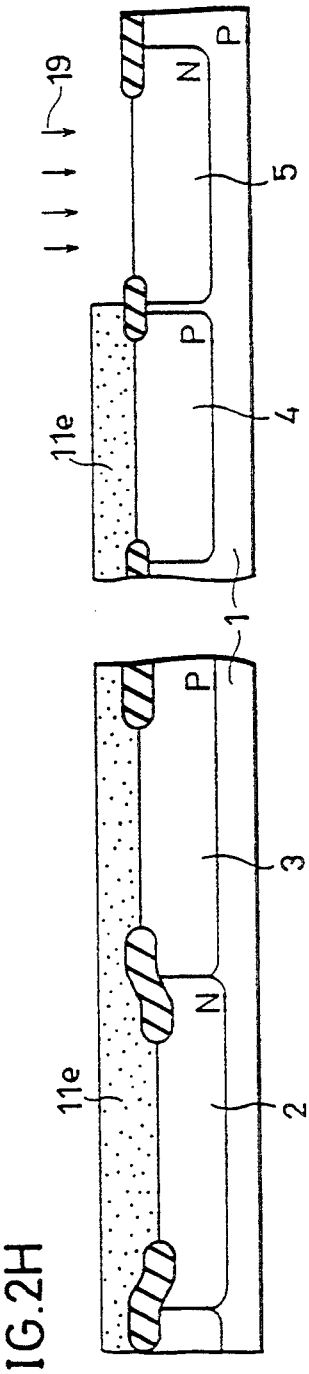
Figure 3:
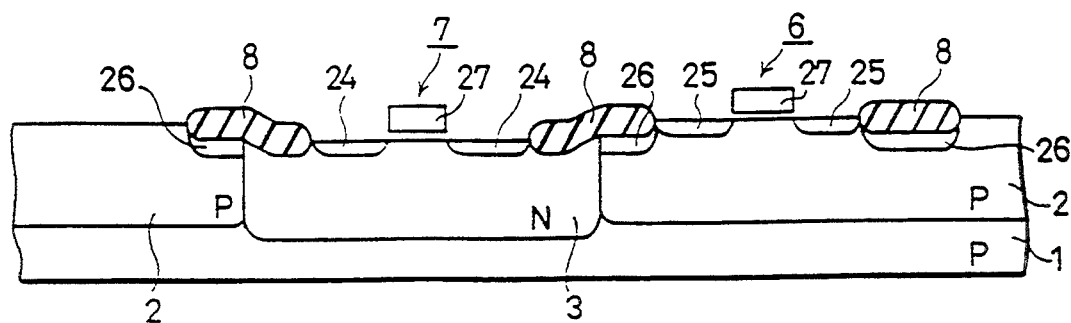
FIG. 3 is a structural cross-sectional typical view of a semiconductor memory device having a conventional diffusion-type well structure.
Figure 4A:
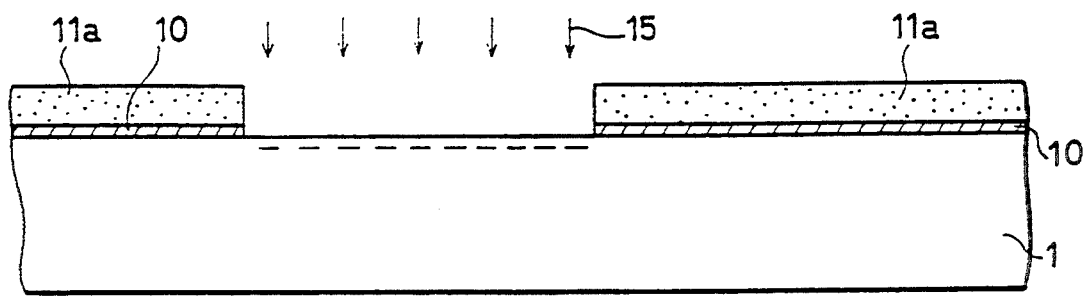
FIGS. 4A, 4B, 4C, 4D, 4E and 4F are cross-sectional views of a manufacturing process of the semiconductor memory device shown in FIG. 3.
Figure 4B:
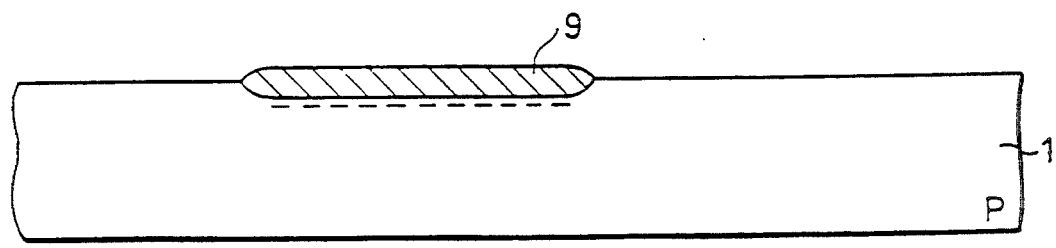
Figure 4C:
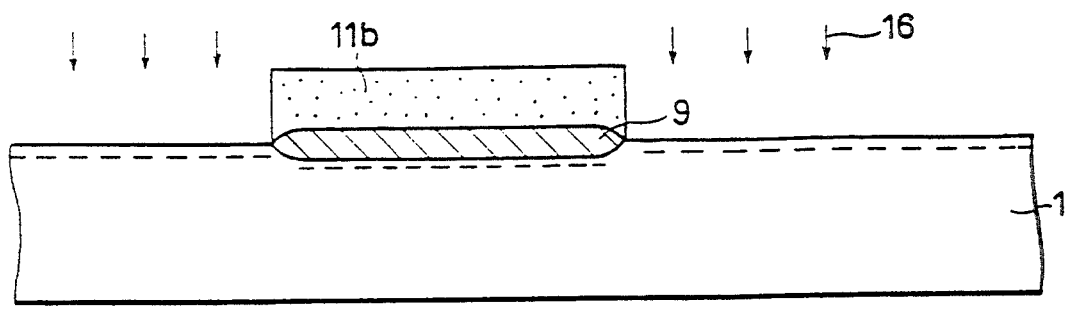
Figure 4D:
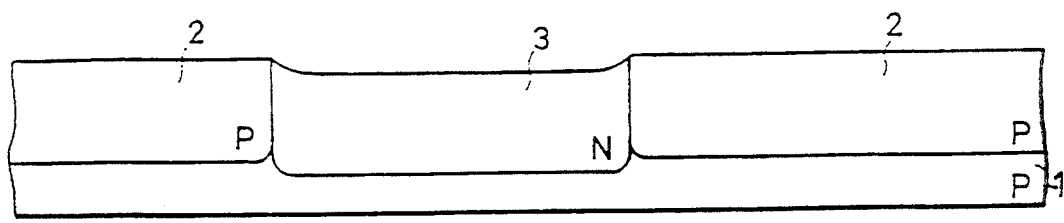
Figure 4E:
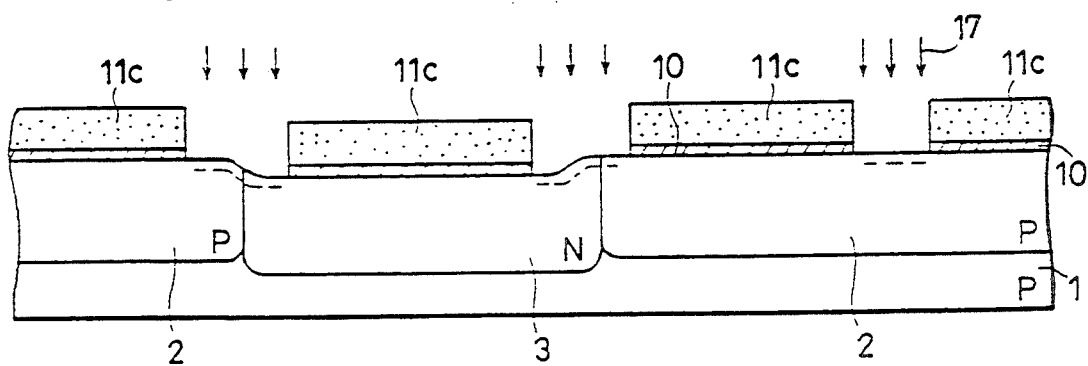
Figure 4F:
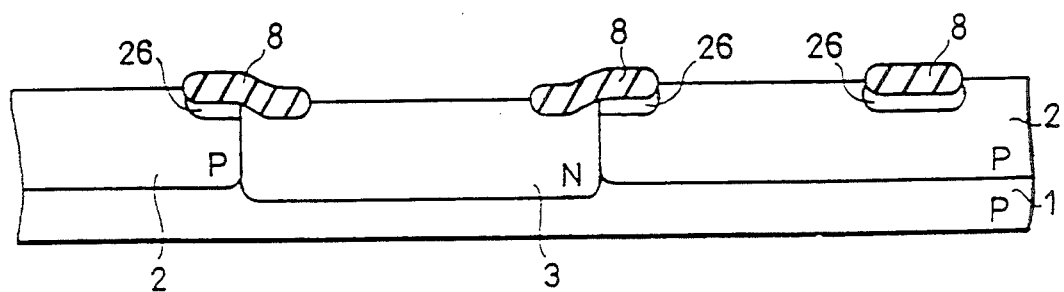
Figure 5:
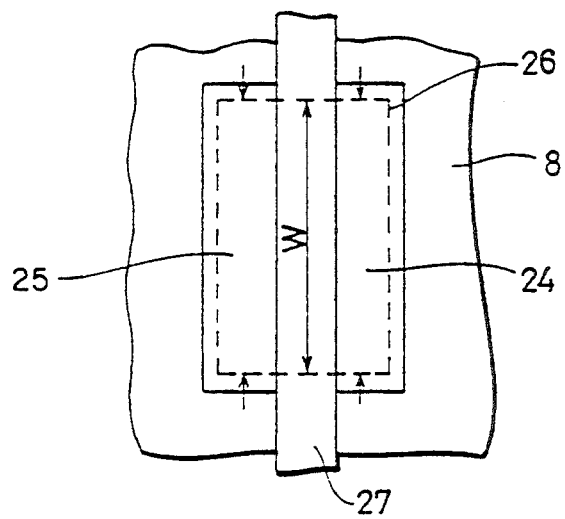
FIG. 5 is a structural plan view of the semiconductor memory device of FIG. 3.

Referring to FIG. 2H, after removing the resist 11d, the surface of the silicon substrate in the peripheral circuit region and the surface of the p-well region 4 in the memory cell array region are covered with a resist 11e again. Ion-implantation is conducted 4 times in the region of the silicon substrate 1 to be an n-well region 5 with this resist 11e as a mask. In the first ion-implantation phosphorus ions 19 are implanted deep in the position of the substrate with an implantation energy 1.0 to 1.5 MeV, doze $1.0 \times 10^{13}$ to $1.0 \times 10^{14}$ cm$^{-2}$. Ion-implantation is effected in the second ion-implantation with an implantation energy 350 to 500 keV, dose 2.0 to $8.0 \times 10^{12}$ cm$^{-2}$. Phosphorus ions are implanted on the surface of the substrate with an implantation energy 120 to 200 keV, dose 2.0 to $8.0 \times 10^{12}$ cm$^{-2}$ in the third ion-implantation. Furthermore, boron ions are counter-dosed in the fourth ion-implantation with an implantation energy 20 to 50 keV, dose $1.0 \times 10^{11}$ to $1.0 \times 10^{13}$ cm$^{-2}$ and then the resist 11e is removed. After that, in some cases, a thermal treatment is applied at a temperature of 900° C. to 1000° C. for about 30 to 60 minutes. A P-well 4 and an N-well 5 are formed in this stage.

After that, a functional device such as a MOS transistor is formed on the surface of each well region in the peripheral circuit portion and the memory cell array portion.

While the well region of the memory cell array has a retrograde well structure using an ion-implantation process 3 times in the above-mentioned embodiment, the number of times of the ion-implantation process is not limited to 3 times, and ion-implantation may be conducted on various conditions so that a predetermined impurity concentration profile may be obtained.

Figure 11A:
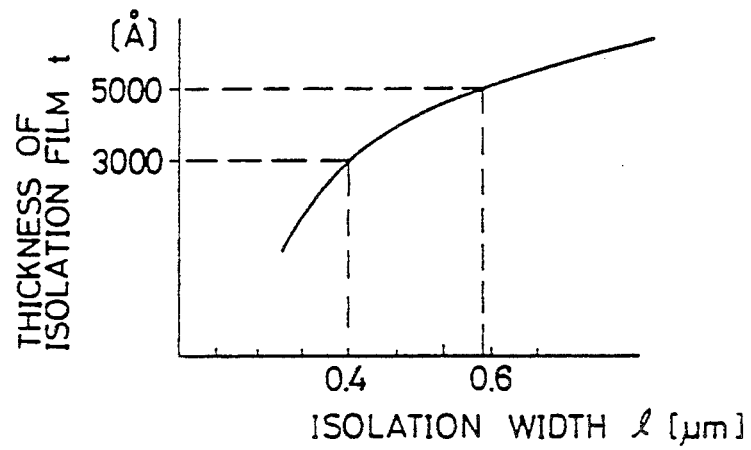
FIG. 11A is a diagram of the relationship between the isolation width and the thickness of an isolation film.
Figure 11B:
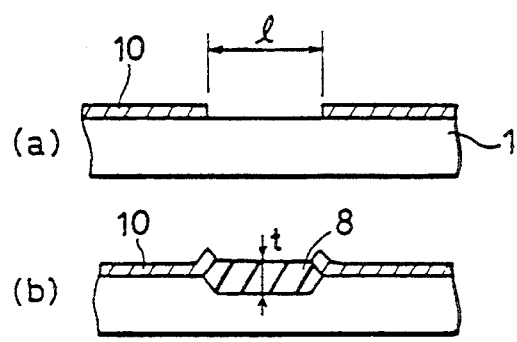
FIG. 11B is a diagram of a manufacturing process showing a main manufacturing process of an isolation film obtained by the LOCOS.

While the use of the well structure is divided based on the functions of the memory cell array and the peripheral circuit portion in the above-mentioned DRAM, there may be cases in which the isolation width of an isolation oxide film for isolation is used or the channel width of a transistor formed on the well region is used as another basis for dividing the use. Referring to FIG. 11A, when the isolation width of the isolation oxide film is used as a basis, the isolation width can be divided for example, at 0.6 μm. That is, the retrograde well structure is applied in a region where the isolation width is 0.6 μm or below to control the occurrence of the narrow channel effect and enables to form a MOS transistor having a miniaturized structure. The diffusion-type well structure can be used in a region where the isolation width of 0.6 μm or above can be ensured to form a MOS transistor having a relatively large channel width and implement isolation without fail.

Figure 6:
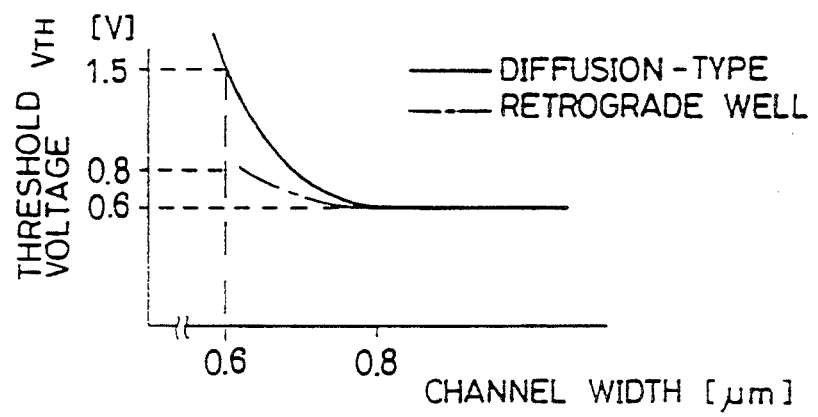
FIG. 6 is a diagram showing the relationship due to a well structure between the channel width and the threshold voltage of a MOS transistor.
Figure 7:
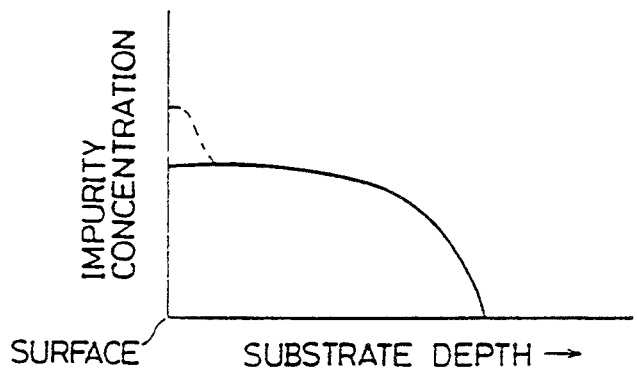
FIG. 7 is a diagram of a concentration profile showing an impurity concentration profile of a diffusion-type well structure.
Figure 8:
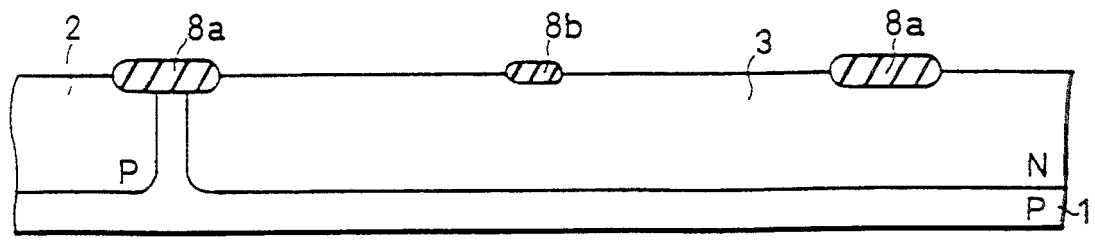
FIG. 8 is a structural cross-sectional typical view of a semiconductor memory device having a conventional retrograde well structure.
Figure 9A:
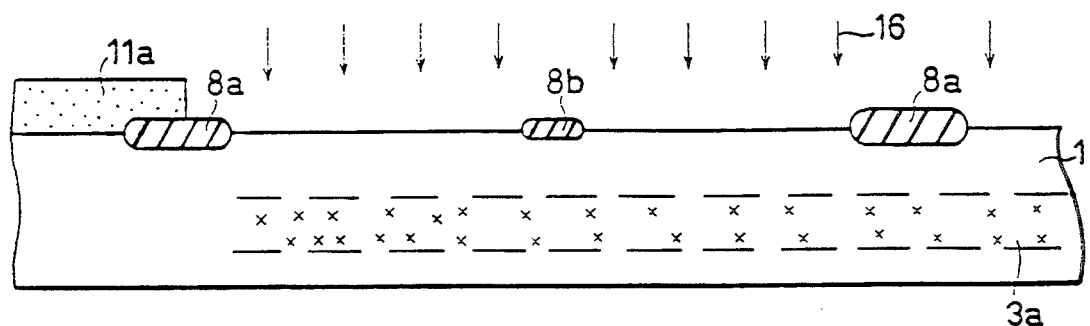
FIGS. 9A, 9B and 9C are cross-sectional views of a manufacturing process of the semiconductor memory device shown in FIG. 8.
Figure 9B:
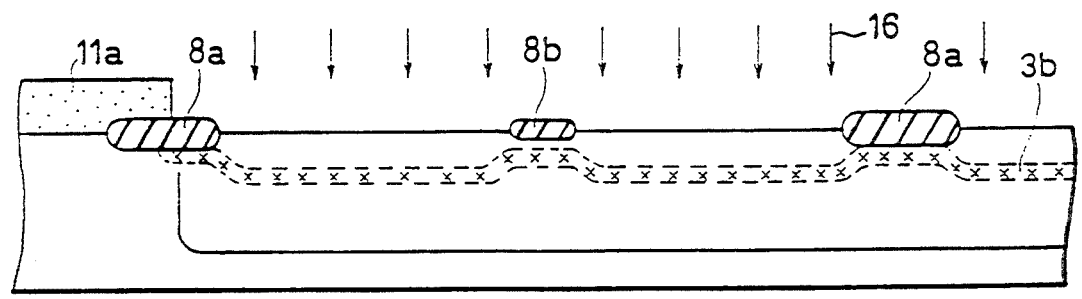
Figure 9C:
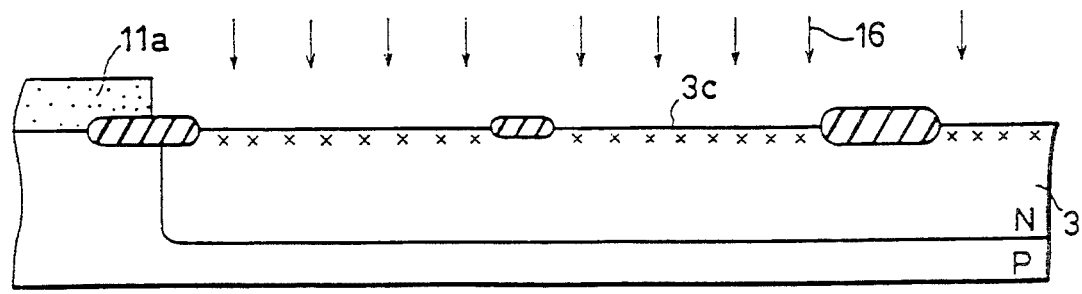

When the channel width of the MOS transistor is used as a basis, as shown in FIG. 6, the increase of the threshold voltage $V_{TH}$ can be controlled by employing the retrograde well structure when the channel width is 0.8 μm or below. The diffusion-type well structure can be used in a region where the channel width is 0.8 μm or above.

In this way, in accordance with the present invention, a semiconductor memory device can be implemented in which the disadvantages which each well structure has can be offset, the narrow channel effect can be prevented or the structure of isolation can be improved, for example, by applying a diffusion-type well structure in a peripheral circuit portion including a MOS transistor having a relatively large channel width and applying a retrograde well structure in a memory cell array including a MOS transistor having a miniaturized structure. In addition, in the manufacturing method thereof, well regions can be formed having different structures of a diffusion-type and a retrograde type on one substrate, utilizing well-known technologies.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a semiconductor substrate with a main surface, said substrate including;
    a first region formed in said main surface and having
        a first isolation field oxide formed on said main surface, said first isolation field oxide separating and isolating semiconductor devices formed within said semiconductor substrate from each other in directions parallel to said main surface, said first isolation field oxide having a first thickness in a direction normal to said main surface,
        a first impurity concentration profile with a first concentration peak at a first depth beneath said main surface,
        a second concentration peak at a second depth beneath said main surface and underlying said first isolation field oxide, and
        a third concentration peak at a third depth beneath said main surface, said first depth > said second depth > said third depth, and said first concentration peak > said third concentration peak and said first concentration peak > said second concentration peak; and
    a second region formed in said main surface independently of said first region and having
        a second isolation field oxide formed on said main surface, said second isolation field oxide separating and isolating semiconductor devices formed within said semiconductor substrate from each other in directions parallel to said main surface, said second isolation field oxide having a second thickness, greater than the first thickness, in a direction normal to said main surface, and
        a second impurity concentration profile with impurity concentration monotonically decreasing as depth from said main surface increases.

2. The semiconductor memory device according to claim 1 wherein,
    said first region comprises a retrograde well region formed in a main portion of said main surface of said semiconductor substrate, and
    said second region comprises a diffusion-type well region formed in a peripheral portion of said main surface of said semiconductor substrate.

3. A semiconductor memory device comprising:
    a semiconductor substrate having a main surface;
    a memory cell portion having a plurality of memory cells arranged for storing information;
    a circuit portion for accessing said plurality of memory cells for writing and reading of said information; and
    a peripheral circuit portion for performing a predetermined circuit operation;
    said semiconductor substrate including
        a first region formed in said main surface and having
            a first isolation field oxide formed on said main surface, said first isolation field oxide separating and isolating semiconductor devices formed within said semiconductor substrate from each other in directions parallel to said main surface, said first isolation field oxide having a first thickness in a direction normal to said main surface,
            a first impurity concentration profile with a first concentration peak at a first depth beneath said main surface,
            a second concentration peak at a second depth beneath said main surface and underlying said first isolation field oxide having a first thickness, and
            a third concentration peak at a third depth beneath said main surface, said first depth > said second depth > said third depth, and said first concentration peak > said third concentration peak and said first concentration peak > said second concentration peak; and
        a second region formed in said main surface independently of said first region and having
            a second isolation field oxide formed on said main surface, said second isolation field oxide separating and isolating semiconductor devices formed within said semiconductor substrate from each other in directions parallel to said main surface, said second isolation field oxide having a second thickness, greater than the first thickness, in a direction normal to said main surface, and a second impurity concentration profile with impurity concentration monotonically decreasing as depth from said main surface increases, wherein said first region includes at least a portion of said memory cell portion and said circuit portion, and said second region includes at least a portion of said peripheral circuit portion and no portion of said memory cell portion and said circuit portion.

4. The semiconductor memory device according to claim 3 wherein, said first region comprises a retrograde well region formed in a main portion of said main surface of said semiconductor substrate, and said second region comprises a diffusion-type well region formed in a peripheral portion of said main surface of said semiconductor substrate.

5. A semiconductor memory device comprising:

a semiconductor substrate having a main surface;

a memory cell portion having a plurality of memory cells arranged for storing information;

a circuit portion for accessing said plurality of memory cells for writing and reading of said information; and a peripheral circuit portion for performing a predetermined circuit operation;

said semiconductor substrate including a first region formed in said main surface and having a first impurity concentration profile of a first impurity type with a first concentration peak at a first depth beneath said main surface, a second concentration peak at a second depth beneath said main surface, and a third concentration peak at a third depth beneath said main surface, said first depth > said second depth > said third depth, and said first concentration peak > said third concentration peak and said first concentration peak > said second concentration peak, a second region formed in said main surface and having a second impurity concentration profile of a second impurity type with a first concentration peak at a first depth beneath said main surface, a second concentration peak at a second depth beneath said main surface, and a third concentration peak at a second depth beneath said main surface, said first depth > said second depth > said third depth, and said first concentration peak > said third concentration peak and said first concentration peak > said second concentration peak, a third region formed in said main surface and having a third impurity concentration profile of said first impurity type with impurity concentration monotonically decreasing as depth from said main surface increases, a fourth region formed in said main surface and having a fourth impurity concentration profile of said second impurity type with impurity concentration monotonically decreasing as depth from said main surface increases, a first isolation field oxide formed on said main surface, said first isolation field oxide separating and isolating semiconductor devices, formed within said semiconductor substrate in the first and second regions, from each other in directions parallel to said main surface with the second concentration peak at a second depth of each region underlying a respective portion of said first isolation field oxide, said first isolation field oxide having a first thickness in a direction normal to said main surface, and a second isolation field oxide formed on said main surface, said second isolation field oxide separating and isolating semiconductor devices, formed within said semiconductor substrate in the third and fourth regions, from each other in directions parallel to said main surface, said second isolation field oxide having a second thickness, greater than the first thickness, in a direction normal to said main surface, wherein, said first, second, third and fourth regions are formed independently of each other, said first and second regions include said memory cell array, and said third and fourth regions include said peripheral circuit portion.

6. The semiconductor memory device according to claim 5 wherein, said first and second regions comprise retrograde well regions formed in a main portion of said main surface of said semiconductor substrate, said third and fourth regions comprise diffusion-type well regions formed in a peripheral portion of said main surface of said semiconductor substrate, and said memory cell array comprises a plurality of CMOS memory cells including pairs of transistors formed in respective retrograde well regions.

7. The semiconductor memory device according to claim 5 further comprising:

a plurality of first and second MOS transistors, wherein said first and second regions are retrograde-type well regions, and said third and fourth regions are diffusion-type well regions, said array of memory cells is formed in said retrograde-type well regions and includes said first MOS transistors, and said peripheral circuit is formed in said diffusion well regions and includes said second MOS transistors.

8. A semiconductor memory device comprising:

a semiconductor substrate having a main surface; and a memory cell portion having a plurality of memory cells arranged for storing information;

a circuit portion for writing and reading of said information;

a peripheral circuit portion for performing a predetermined circuit operation;

said semiconductor substrate including a first region formed in said main surface and having a plurality of first wells each having a first impurity concentration profile with a first concentration peak at a first depth beneath said main surface, a second concentration peak at a second depth beneath said main surface, and a third concentration peak at a third depth beneath said main surface, said first depth > said second depth > said third depth, and said first concentration peak > said third concentration peak and said first concentration peak > said second concentration peak; and a second region formed in said main surface independently of said first region and having a plurality of second wells each having a second impurity concentration profile with impurity concentration monotonically decreasing as depth from said main surface increases;

said first region including at least a portion of said memory cell portion and said circuit portion, and said second region including at least a portion of said peripheral circuit portion and no portion of said memory cell portion and said circuit portion, a plurality of first isolation field oxides formed on said main surface, said plurality of first isolation field oxides separating and isolating semiconductor devices, formed within said semiconductor substrate of said memory cell portion and said circuit portion, from each other in directions parallel to said main surface, said plurality of first isolation field oxides having a first thickness in a direction normal to said main surface, and a plurality of second isolation field oxides formed on said main surface, said plurality of second isolation field oxides separating and isolating semiconductor devices, formed within said semiconductor substrate of said peripheral circuit portion, from each other in directions parallel to said main surface, said second isolation field oxide having a second thickness, greater than the first thickness, in a direction normal to said main surface, wherein an isolation field oxide having a first thickness is formed between each of the plurality of first wells of said first region with the second concentration peak at a second depth of each well underlying a respective portion of said isolation field oxide, and an isolation field oxide having a second thickness is formed between each of the plurality of second wells of said second region.

* * * * *